(12) United States Patent
Rinn

(10) Patent No.: US 6,317,991 B1
(45) Date of Patent: Nov. 20, 2001

(54) METHOD FOR CORRECTING MEASUREMENT ERRORS IN A MACHINE MEASURING CO-ORDINATES

(75) Inventor: Klaus Rinn, Heuchelheim (DE)

(73) Assignee: Leica Microsystems Wetzlar GmbH, Wetzlar (DE)

( * ) Notice: Subject to any disclaimer, the term of this patent is extended or adjusted under 35 U.S.C. 154(b) by 0 days.

(21) Appl. No.: 09/269,768

(22) PCT Filed: Jun. 25, 1998

(86) PCT No.: PCT/DE98/01744

§ 371 Date: Apr. 9, 1999

§ 102(e) Date: Apr. 9, 1999

(87) PCT Pub. No.: WO99/08070

PCT Pub. Date: Feb. 18, 1999

(30) Foreign Application Priority Data

Aug. 11, 1997 (DE) .............................. 197 34 695

(51) Int. Cl.⁷ .......................... G01B 5/004; G01B 21/04; G06F 19/00
(52) U.S. Cl. .............................. 33/1 M; 33/503; 33/504; 33/702; 324/758; 700/194; 702/94; 702/95; 702/150
(58) Field of Search ............................ 33/1 M, 503, 504, 33/702, 706; 324/751, 752, 758; 702/94, 95, 150, FOR 145, FOR 146, FOR 147, FOR 156, FOR 157, FOR 159, FOR 160; 700/194, 195

(56) References Cited

U.S. PATENT DOCUMENTS 4,730,927  3/1988  Ototake et al. .................. 356/371

OTHER PUBLICATIONS

William, H. Press, Brian.P. Flannery, Saul A. Teukolsy, William T. Vetterling. *Numerical Recipes The Art of Scientific Computing,* Cambridge University Press, 1986, pp. 509–521.

LMS IPRO Correction Software, Software Manual Release V. 4, Sep. 1998, pp. 195–216.

Dr. Klaus–Dieter Röth, Dr. Carola Bläsing–Bangert, *Two Dimensional Metrology Using the LMS 2020 Actual Performance Data,* 1994, pp. 1–10.

Richard Stevens Burington, Ph.D. *Handbook of Mathematical Tables and Formulas,* Mar. 1948, pp. 26–27.

*Primary Examiner*—Randy W. Gibson
(74) *Attorney, Agent, or Firm*—Foley & Lardner

(57) ABSTRACT

The invention describes a method for selfcalibration of a coordinate-measuring machine, in which the coordinates of structures on an uncalibrated reference object are measured in a plurality of rotary positions on the object table of the coordinate-measuring machine, the measured coordinates are rotated back into the initial position by means of rotation functions, and a correction function is determined such that the rotated-back coordinates agree in an optimum fashion with the coordinates of the initial orientation. Each reference object is rotated about only one axis in this process. Rotationally symmetrical linear combinations of the fit functions used to approximate the correction function are determined and left out of account in the approximation. The correction functions generated are systematically complete and include no undetermined or defective terms.

7 Claims, 2 Drawing Sheets

METHOD FOR CORRECTING MEASUREMENT ERRORS IN A MACHINE MEASURING CO-ORDINATES

Figure 1C:
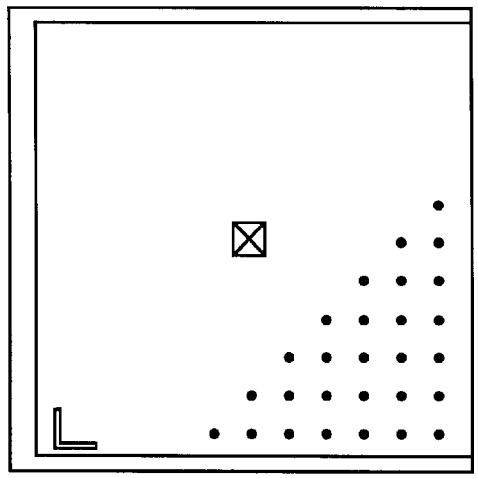

The invention relates to a method for determining a correction function for rectifying the coordinate-dependent measuring errors of a coordinate-measuring machine by means of selfcalibration.

High-precision coordinate-measuring machines are used in the semiconductor industry for the purpose of measuring the structures on masks or wafers. The precise knowledge of the coordinates of the structures on masks is mandatory in order to be able to carry out controlled fabrication of integrated circuits.

The measured values of these high-precision coordinate-measuring machines have error components which depend on the measuring point, that is to say the measured coordinate itself. In this case, there are systematic error components which result from the design and the selection of the components of the coordinate-measuring machine itself. Thus, for example, known causes of error are deficiencies in the mirror orthogonality and the mirror planes, distortions in the scaling of the measuring axes (so-called cosine errors) and the sagging of the mask used for correction.

High-precision coordinate-measuring machines require coordinate-dependent error correction in order to achieve the highest accuracy in the measurements. Determining this correction is generally achieved by comparison with a standard. However, there is as yet no sufficiently accurate standard in the case of extremely high accuracies such as are required, for example, in the measurement technology of semiconductor substrates. It is known for this purpose to calibrate a coordinate-measuring machine with itself by measuring one and the same object in a plurality of rotary positions. An error correction function generated by self-calibration is used to detect all the errors of the coordinate-measuring machine, with the exception of a scaling error. The latter can be determined only by comparison with a calibrated length standard.

PRIOR ART

U.S. Pat. No. 4,583,298 describes the selfcalibration of a coordinate-measuring machine with the aid of a so-called calibration plate, on which a grating is arranged. The positions of the grating points are, however, not calibrated. The grating plate is laid onto the object table of the coordinate-measuring machine, and the positions of its grating points are measured. The same grating plate is then rotated further twice or several times by 90° in each case about a rotation axis, and the positions of the grating points are measured in each of the set orientations. The measurement results are rotated back mathematically, and various correction factors and tables are optimized such that the rotated-back data records agree more effectively.

U.S. Pat. No. 4,583,298 closely examines the problem of defective or unreliable corrections. Errors in the measurement of the measured values used to determine the correction are ascertained as the cause. It is shown that a mathematically unique correction can be achieved only when more than two different rotary positions are measured with the aid of the same grating plate, and in the process centers of rotation for the rotations between the rotation axes are sufficiently different. As is known, for this purpose the grating plate is laid onto the object table, and the positions of its grating points are measured in a plurality of orientations of the grating plate. The orientations are, for example, achieved by multiple rotations by 90° about their midpoints. Thereafter, however, the grating plate must be displaced to a completely different position on the object table. There, as already previously known, the measurement of the positions of their grating points is repeated in a plurality of orientations. It is essential in this process that the same grating plate must be displaced on the object table.

This requirement turns out in practice, however, to be disadvantageous; the point is that the simplest thing is to rotate the grating plate by angles at which the external dimensions go over into one another. In this case, the center of rotation is always the midpoint of the grating plate. Thus, for example, in U.S. Pat. No. 4,583,298 a square calibration plate is inserted into a square frame and is set down again in it shifted by 90° after each measurement. All the centers of rotation are thereby identical with the midpoint of the calibration plate. Only when the centers of rotation lie far apart, that is to say their spacings are similar in magnitude to the spacings of the calibration structures, is the error correction better. However, even in the case of realizing clearly differing centers of rotation, the determined correction factors and the result of the correction are never completely satisfactory.

The holding mechanism such as, for example, the square frame must be displaced in order to permit a significant displacement of the centers of rotation. The measuring range also needs to be enlarged by comparison with the undisplaced object in this case. There are substantial disadvantages associated with the measures required for this modification of the coordinate-measuring machine. Thus, there is a problem in fitting a displaceable holding frame for the calibration plate on the object table. Specifically, if other mask holders are present on the sample table (for example vacuum chuck or special multipoint bearing), these would need to be specially dismantled for the calibration measurements. Laying a holding frame onto existing mask holders is likewise not an option, since said holders could be damaged or not offer a flat bearing surface for the holding frame.

The enlargement of the measuring range for the purpose of measuring the calibration plate in the displaced state also presents a problem. It requires costly structural changes which are reflected in the fabrication costs of the machine. The external dimensions of the machine are also enlarged. However, the floor space of the machine directly affects its operating costs, because floor space in the clean room is very costly in the semiconductor industry.

OBJECT

It is therefore the object of the invention to specify a method for determining a correction function for rectifying the coordinate-dependent measuring errors of a coordinate-measuring machine, in which, when carrying out the calibration measurements using the already present, non-displaceable maskholders, rotations of the respective calibration substrate about a single center of rotation suffice without the need also to displace the calibration substrate. An optimum error correction is to be achieved, nevertheless. The aim is to specify a continuous correction function with the aid of which it is possible to correct arbitrary measuring points in the entire measuring range, that is to say also between the points of a calibration grating.

This object is achieved according to the invention by means of the independent Patent claim 1 in the case of a method of the type mentioned at the beginning. Advantageous refinements and developments of the invention are the subject matter of the subclaims.

DESCRIPTION

In mathematical terms, a correction function, depending on the measuring point, for rectifying the coordinate-dependent measuring errors of a coordinate-measuring machine is a two- or three-dimensional function $\overline{K}(\overline{r})$. The correction function is always continuous and differentiable in practice. Applying this correct ion function $\overline{K}(\overline{r})$ to a measured defective raw coordinate $\overline{r}$ (by which the position vector is meant) of a structure of an arbitrary measurement object produces the associated corrected coordinate $\overline{r}_{corr}=\overline{r}+\overline{K}(\overline{r})$.

In order to determine the correction function $\overline{K}(\overline{r})$ the latter is approximated by a series expansion of a set of prescribed fit functions $\overline{k}_i(\overline{r})$. It therefore holds that:

$$\overline{K}(\overline{r}) \approx \sum_{i=0}^{N} a_i \cdot \overline{k}_i(\overline{r}),$$

$a_i$=fit parameter and N=number of the prescribed fit functions $\overline{k}_i(\overline{r})$.

In order to determine the correction function $\overline{K}(\overline{r})$, it is therefore necessary for the fit parameters $a_i$ to be determined relative to the fit functions $\overline{k}_i(\overline{r})$ such that the correction is optimized, that is to say the residual error is minimized or vanishes.

The invention proceeds from the finding that there are special components of the correction function $\overline{K}(\overline{r})$ which are not uniquely determined or are affected by a very large error. These are chiefly components which in the case of the calibration measurements all the orientations of a reference object used for calibration purposes always go over into themselves (exactly or only approximately), that is to say the rotationally symmetrical components are invariant for the rotations of the reference object carried out. This concerns in each case a linear combination $\overline{S}(\overline{r})$ of fit functions $\overline{k}_i(\overline{r})$ which is rotationally symmetrical as a whole relative to all the rotations $D_k$ carried out. The symmetry condition $\overline{S}(\overline{r})=D_k\overline{S}(\overline{r})$ then holds. It was then possible to consider a single identifiable fit function $\overline{k}_i(\overline{r})$ as a special case of linear combination.

These rotationally symmetrical components in the form of a linear combination $\overline{S}(\overline{r})$ make no contribution, or a very inaccurate one, to the approximation of the ideal, that is to say exactly correct correction function $\overline{K}(\overline{r})$. Thus, the presence of such rotationally symmetrical components can result in it being impossible for the fit parameters $a_i$ to be uniquely determined relative to the fit functions $\overline{k}_i(\overline{r})$. In order to improve the error correction, in accordance with the invention they are therefore removed from the series expansion of the correction function $\overline{K}(\overline{r})$ or excluded with the aid of measurement technology.

The invention therefore specifies a method for correcting the error of a coordinate-measuring machine, which specifically takes no account of the rotationally symmetrical error components. Three different exemplary embodiments A, B and C are specified.

A: A first solution, employing measurement technology, is a method in which by measuring with the aid of two differently dimensioned reference objects no rotationally symmetrical components are produced in the correction function.

B: A second solution is a method in which by making measurements on a single reference object the rotationally symmetrical linear combinations $\overline{S}(\overline{r})$ of the fit functions $\overline{k}_i(\overline{r})$ are determined and removed from the set of the fit functions. The correction function is then approximated using the reduced set of fit functions.

C: Although the rotationally symmetrical linear combinations $\overline{S}(\overline{r})$ have a disturbing effect in the determination of the fit parameters $a_i$, they are desired for the purpose of describing specific error components, and are therefore included originally in the general set of the fit functions. Consequently, there is specified as a third solution a method for determining a correction function $\overline{K}(\overline{r})$ with the aid of which by making measurements with two differently dimensioned reference objects the rotationally symmetrical error components determined in the case of the approximation of the correction function are firstly eliminated, and thereafter reintroduced into the approximated correction function.

The correction function $\overline{K}(\overline{r})$ is optimized by entirely covering the measuring range of the coordinate-measuring machine by means of one of the reference objects in each case.

Figure 1B:
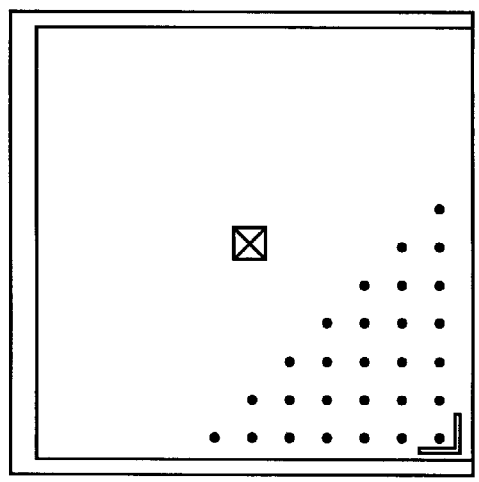
Figure 1A:
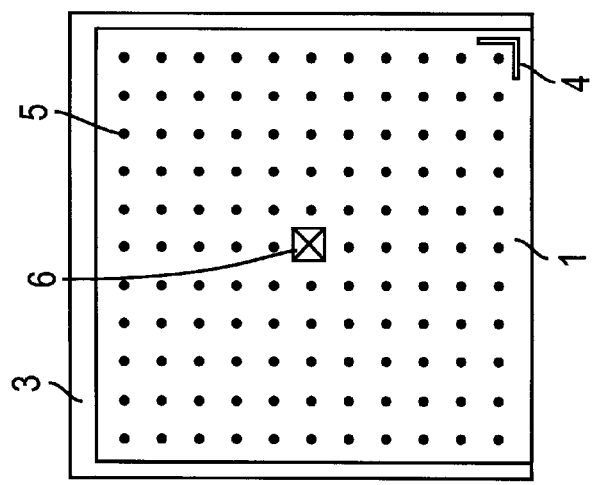
Figure 2A:
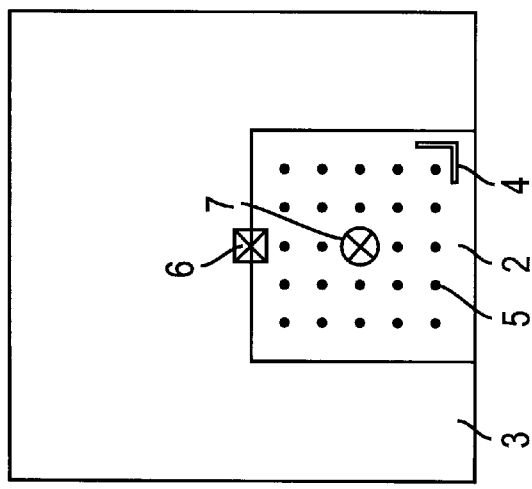
Figure 2B:
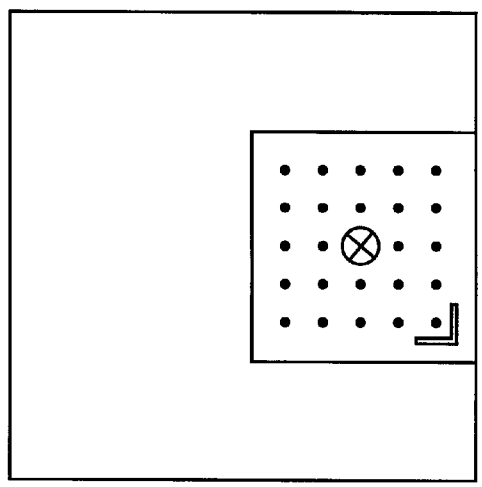
Figure 2C:
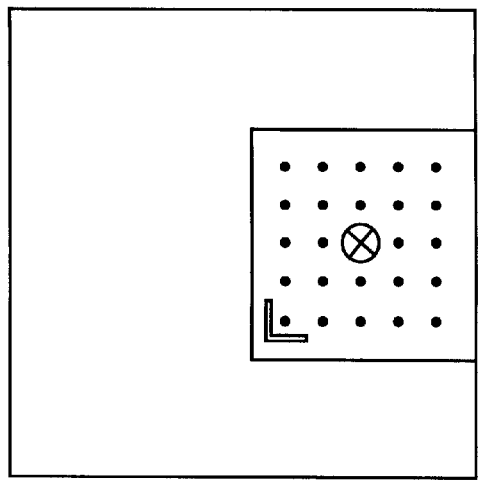

The invention is explained in more detail below with reference to exemplary embodiments with the aid of the diagrammatic drawings, in which:

FIG. 1a: shows a first reference object in an initial orientation k=0,

FIG. 1b: shows a first reference object in a first calibration orientation k=1,

FIG. 1c: shows a first reference object in a second calibration orientation k=2, FIG. 2a: shows a second reference object in an initial orientation k=0, FIG. 2b: shows a second reference object in a first calibration orientation k=1, and FIG. 2c: shows a second reference object in a second calibration orientation k=2.

A: DESCRIPTION OF A METHOD USING MEASUREMENT TECHNOLOGY TO REALIZE AN EXEMPLARY EMBODIMENT AS SPECIFIED IN CLAIM 2

FIG. 1a shows a rigid, uncalibrated reference object 1 which is laid onto an object table 3 of a coordinate-measuring machine for the purpose of carrying out selfcalibration in the initial orientation k=0. The current orientation of the reference object 1 is indicated by a mark 4. It appears in the initial orientation in the right-hand lower corner of the reference object 1. The reference object 1 is selected to be so large that it covers the entire measuring range of the coordinate-measuring machine and consequently virtually the entire object table 3.

A conventional mask holder (not represented, for the purpose of simplification) which is designed for measuring square masks serves to hold the reference object 1. Thus, it is known for the mask to be mounted on three bearing points in a fashion free from reactive forces. The sagging produced by the dead weight is calculated, and removed from the measured coordinates of the structure of the mask by calculation. Other mask holders suck the mask on with the aid of vacuum feet. However, this produces imprecisely describable sagging of the mask. In the example considered, the reference object 1 (like other reference objects later) is always laid flush against the lower edge of the object table 3, which edge also serves as a bearing for the masks to be measured, and relative to which displaceable points of support for different mask sizes are present.

A number j of reference structures 5 are selected on the reference object 1, the aim being to measure their coordinates in order to carry out the selfcalibration. Firstly, the reference object 1 is laid onto the mask holder in the initial orientation. The initial coordinates (of the position vector) $\overline{r}_{1j0}$ selected reference structures 5 are measured in this initial orientation k=0 of the first reference object 1.

Thereafter, the reference structures 5 of the reference object 1 still have to be measured in at least one other orientation of the reference object 1. This so-called calibration orientation must differ from the initial orientation and have been produced by rotation from the initial orientation about a rotation axis 6. If, as in this example, a square reference object 1 is selected and the latter is always laid flush against the lower edge of the object table 3, a rotation axis 6 passing vertically through the middle of the reference object 1 is recommended on the basis of the existing mask holder.

FIG. 1b shows the reference object 1 in the first calibration orientation k=1. It is produced from the initial orientation by a 90-degree rotation about the rotation axis 6 through the middle of the reference object 1. The mark 4 appears in the first calibration orientation in the left-hand lower corner of the reference object 1. The calibration coordinates $\bar{r}_{1j1}$ of the j reference structures 5 of the first reference object 1 are measured in this first calibration orientation k=1.

After measurement in the initial orientation and a calibration orientation, a complete correction function $\overline{K}(\bar{r}_{jk})$ can already be calculated. In order to generate an optimized correction function $\overline{K}(\bar{r}_{jk})$, it is advantageously possible to measure calibration coordinates of the reference structures 5 in at least one further calibration orientation different from the orientations of the reference object 1 previously used, as is described below.

FIG. 1c shows the reference object 1 in the second calibration orientation k=2. It is produced from the initial orientation by a 180-degree rotation about the rotation axis 6 through the middle of the reference object 1. The mark 4 appears in the second calibration orientation in the left-hand upper corner of the reference object 1. The calibration coordinates $\bar{r}_{1j2}$ of the j reference structures 5 are measured in this second calibration orientation k=2.

Thus, relative to the reference structures 5 the initial coordinates r1j0 have been measured on the reference object 1 in the initial orientation k=0, the calibration coordinates $\bar{r}_{1j1}$ have been measured in the calibration orientation k=1, and the calibration coordinates r1j2 have been measured in the calibration orientation k=2. Measurements of the coordinates of the reference structures 5 are now required on a second reference object 2. This must also be measured in mutually differing orientations which are produced by rotation about a common rotation axis. For this purpose, the reference object 1 must be removed from the object table 3 of the coordinate-measuring machine, and a reference object 2 laid on instead.

FIG. 2a shows the second reference object 2 on the object table 3. The second reference object 2 has clearly been selected to be smaller than the previously measured first reference object 1. The mark 4 for identifying the orientation, the reference structures 5 of the second reference object 2 and the middle of the second reference object 2 through which the rotation axis 7 for setting the various orientations passes are represented. It is to be seen that the two rotation axes 6, 7 have a clear spacing from one another owing to the different sizes of the two reference objects 1, 2.

FIG. 2a now shows the second reference object 2 in its initial orientation k=0. The initial coordinates $\bar{r}_{2j0}$ of the reference structures 5 are measured in this orientation.

FIG. 2b shows the second reference object 2 in the first calibration orientation k=1. It is produced by a 90-degree rotation of the reference object 2 from its initial orientation k=0. The calibration coordinates $\bar{r}_{2j1}$ are measured relative to the reference structures 5 in this first calibration orientation k=1 of the second reference object 2.

As is represented in FIG. 2c, the second reference object 2 is brought into the second calibration orientation k=2 by a 180-degree rotation from the initial orientation about the rotation axis 7. The calibration coordinates $\bar{r}_{2j2}$ are measured relative to the reference structures 5 in this calibration orientation k=2.

The initial and calibration coordinates have thereby likewise been measured relative to the reference structures 5 of the second reference object 2 in three different orientations, as has already been carried out for the first reference object 1.

In order to approximate the correction function $\overline{K}(\bar{r}_{jk})$ by means of $$\overline{K}(\bar{r}_{jk}) \approx \sum_{i=0}^{N} a_i \overline{k}_i(\bar{r}_{jk})$$

it is firstly necessary to specify the fit functions $\overline{k}_i(\bar{r}jk)$. Many complete sets of linearly independent functions which can approximate a correction function $\overline{K}(\bar{r}_{jk})$ with arbitrary accuracy are known from the mathematical literature. The best known are, for example, polynomial and Fourier series. Also known are specific linearly independent functions which are particularly suitable for correcting specific errors. A set of fit functions $\overline{k}_i(\bar{r}_{jk})$ which describes the correction function $\overline{K}(\bar{r}jk)$ sufficiently accurately is now provided herefrom.

The initial coordinates $\bar{r}_{1j0}$ and the calibration coordinates $\bar{r}_{1j1}$ and $\bar{r}_{1j2}$ of the first reference object 1, as well as the initial coordinates $\bar{r}_{2j0}$ and the calibration coordinates $\bar{r}_{2j1}$ and $\bar{r}_{2j2}$ of the second reference object 2 are now operated upon by the correction function $\overline{k}_i(\bar{r}_{jk})$ which is to be described by the prescribed linearly independent functions through an approximation. Initially, the fit parameters $a_i$ of the N prescribed linearly independent fit functions $\overline{k}_i(\bar{r}_{jk})$ are still unknown. They are now to be determined. For this purpose, the calibration coordinates which have been operated upon by the correction function $\overline{K}(\bar{r}_{jk})$) are rotated back into the initial orientation respectively assigned to them, by means of rotation functions $D_k$ which describe their rotation into the initial orientation assigned to them, that is to say the calibration coordinates $\bar{r}_{1j1}$ and $\bar{r}_{1j2}$ of the first reference object 1 are rotated back into the initial orientation of the first reference object 1, while on the other hand the calibration coordinates $\bar{r}_{2j1}$ and $\bar{r}_{2j2}$ of the second reference object 2 are rotated back into the initial orientation of the second reference object 2.

Taking account of all the reference structures 5 on the two reference objects 1, 2, the fit parameters a are now calculated such that the corrected initial coordinates associated with a specific reference structure 5, and the corrected and rotated-back calibration coordinates associated therewith agree as well as possible.

An approximation of the correction function $\overline{K}(\bar{r}_{jk})$ is thereby produced which is optimized both for the rotations carried out on the first reference object 1 and for the rotations carried out on the second reference object 2. By virtue of the fact that the two reference objects 1, 2 have individually been rotated in each case about a constant rotation axis but about different rotation axes between themselves, the determined correction function has no components which would be rotationally symmetrical relative to all the rotations used. The correction function $\overline{K}(\bar{r}_{jk})$ cannot include any rotationally symmetrical components as a result of the method of selfcalibration described, since there are no fit functions which could be rotationally symmetrical for rotations about the two axes.

B: DESCRIPTION OF A METHOD FOR REALIZING AN EXEMPLARY EMBODIMENT AS SPECIFIED IN CLAIM 3

As is represented in FIGS. 1a, 1b, 1c, relative to the reference structures 5 of a reference object 1, in this method the initial coordinates $\bar{r}_{1j0}$ are measured in an initial orientation k=0, the calibration coordinates $\bar{r}_{1j1}$ are measured in a first calibration orientation k=1, and the calibration coordinates $\bar{r}_{1j2}$ are measured in a second calibration orientation k=2. It is not necessary to take measurements using a further reference object.

Relative to the prescribed fit functions all the linear combinations $\overline{S}(\bar{r})$ comprising an arbitrary number P of the fit functions $\bar{k}_i(\bar{r}_{jk})$, which go over into one another again with reference to the two rotations carried out are now sought. Each of these rotationally symmetrical linear combinations can be described by $$\overline{S}(\bar{r}) = \sum_{i=0}^{P} s_i \cdot \bar{k}_i(\bar{r}_{jk}).$$

Here, $s_i$ are the fit parameters of this linear combination. Only those linear combinations $\overline{S}(\bar{r})$ are sought which fulfill the symmetry condition $\overline{S}(\bar{r}) = D_k \cdot \overline{S}(\bar{r})$ for all the rotations $D_k$ carried out.

The selected set of the linearly independent fit functions $\bar{k}_i(\bar{r}_{jk})$ must be revised for each rotationally symmetrical linear combination $\overline{S}(\bar{r})$ found. A new set of linearly independent fit functions $\bar{k}_i^{(1)}(\bar{r}_{jk})$ is produced for this purpose, these new fit functions in each case $\bar{k}_i^{(1)}(\bar{r}_{jk})$ being linear combinations of the previous ones $\bar{k}_i(\bar{r}_{jk})$, and initially still defining the same function space. In this case, one of the new linearly independent fit functions $\bar{k}_i^{(1)}(\bar{r}_{jk})$ must be the previously found rotationally symmetrical linear combination $\overline{S}(\bar{r})$, and this may specifically be Nth. It then holds that: $\overline{S}(\bar{r}) = \bar{k}_N^{(1)}(\bar{r}_{jk})$.

This rotationally symmetrical linear combination $\bar{k}_N^{(1)}(\bar{r}_{jk})$, that is to say the Nth is then deleted from the new set of the fit functions $\bar{k}_i^{(1)}(\bar{r}_{jk})$ The number of new fit functions $\bar{k}_i^{(1)}(\bar{r}_{jk})$ is therefore only N−1. Consequently, the new set of fit functions $\bar{k}_i^{(1)}(\bar{r}_{jk})$ no longer defines the same function space as the original set of fit functions $\bar{k}_i(\bar{r}_{jk})$. The dimension of the function space defined by the new fit functions $\bar{k}_i^{(1)}(\bar{r}_{jk})$ has thus been reduced by 1.

Such an adaptation of the set of the fit functions $\bar{k}_i^{(1)}(\bar{r}_{jk})$ is undertaken for each rotationally symmetrical linear combination $\overline{S}(\bar{r})$ found until there are no more linear combinations $\overline{S}(\bar{r})$ which fulfill the abovenamed symmetry condition for all the rotation functions $D_k$. A correction function $\overline{K}(\bar{r}_{jk})$ can then be calculated in a known way only using the last produced set of the fit functions $\bar{k}_i^{(M)}(\bar{r}_{jk})$ after M-fold repetition of the described adaptation of the set of the fit functions.

That is to say, the measured initial coordinates $\bar{r}_{1j0}$ and calibration coordinates $\bar{r}_{1j1} \cdot \bar{r}_{1j2}$ are operated upon mathematically by the correction function $\overline{K}(\bar{r}_{jk})$ to be determined. Thereafter, the corrected calibration coordinates $\bar{r}_{1j1} \cdot \bar{r}_{1j2}$ are rotated back mathematically into the initial orientation k=0. It is then possible for the fit parameters $a_i$ to be determined relative to the correction function $\overline{K}(\bar{r}_{jk})$ being sought, which are to be approximated by the last produced set of the fit functions $\bar{k}_i^{(M)}(\bar{r}_{jk})$. For this purpose, the fit parameters $a_i$ are optimized again such that the corrected and rotated-back calibration coordinates and the corrected initial coordinates agree to the greatest possible extent.

The correction function $\overline{K}(\bar{r}_{jk})$ thus generated is thereby cleared of all undetermined linear combinations $\overline{S}(\bar{r})$ of its fit functions. In this case, however, a reduction in the dimension of the defined function space has been accepted. Given a suitable choice of the original fit functions $\bar{k}_i(\bar{r}_{jk})$, it is now possible that specific fit functions $\bar{K}_i(\bar{r}_{jk})$, which can be assigned to very specific errors, have fallen out of the set of the fit functions $\bar{k}_i^{(M)}(\bar{r}_{jk})$ taken into account when generating the correction function. Although these fit functions with the rotationally symmetrical linear combinations are removed from the set of the fit functions because they have had a disturbing effect in the approximation of the correction function $\overline{K}(\bar{r}_{jk})$, they should actually preferably be retained in the correction function $\overline{K}(\bar{r}_{jk})$ for the purpose of correcting the specific errors assigned to them. A further method, which takes account of this requirement, is described below.

C: DESCRIPTION OF A METHOD FOR REALIZING AN EXEMPLARY EMBODIMENT AS SPECIFIED IN CLAIM 4

By measuring the initial and calibration coordinates of the reference structures 5 on a first reference object 1 in an initial orientation and at least two calibration orientations, as these are represented in FIGS. 1a, 1b, 1c, a correction function $\overline{K}_1(\bar{r}_{jk})$ is determined with the aid of the method steps specified in claim 3 and described in the previous part of the description B, and approximated by means of a modified set of fit functions $\bar{k}_i^{(M)}(\bar{r}_{jk})$. All the linear combinations $\overline{S}(\bar{r})$ rotationally symmetrical relative to the rotations about the first rotation axis 6 are removed from this modified set of the fit functions $\bar{k}_i^{(M)}(\bar{r}_{jk})$ The dimension of the function space defined by the fit functions is reduced by 1 for each rotationally symmetrical linear combination $\overline{S}(\bar{r})$ deleted.

As already explained, the rotationally symmetrical linear combinations $\overline{S}(\bar{r})$ are removed from the original base of the fit functions $\bar{k}_i(\bar{r}_{jk})$, because the fit parameters $a_i$ cannot be determined using the rotationally symmetrical linear combinations $\overline{S}(\bar{r})$ as base function. Given a specific choice of the original fit function base, however, the rotationally symmetrical linear combinations $\overline{S}(\bar{r})$ include components which are to be used specifically to describe specific errors, and are therefore desired in the correction function. After the fit parameters $a_i$ of the first correction function $\overline{K}_1(\bar{r}_{jk})$ have been determined in relation to the rotations of the first reference object 1, an attempt is made to replace the deleted components of the original function base, that is to say the rotationally symmetrical linear combinations $\overline{S}(\bar{r})$ in the correction functions.

For this purpose, a second correction function $\overline{K}_2(\bar{r}_{jk})$ is determined on a second reference object 2 with the aid of a second rotation axis 7. For this purpose, the coordinates of the reference structures 5 of the second reference object 2 are measured in the initial orientation k=0, and at least two further different calibration orientations k=1 and k=2, as represented in FIGS. 2a, 2b, 2c are measured. These calibration orientations are produced from the initial orientation by rotations with the aid of the rotation functions $D_{2k}$. The initial coordinates $\bar{r}_{2j0}$ and calibration coordinates $\bar{r}_{2j1} \cdot \bar{r}_{2j2}$ thus measured are all corrected with the aid of the first correction function $\overline{K}_1(\bar{r}_{jk})$ already determined.

Using the method steps of claim 3, a second correction function $\overline{K}_2(\bar{r}_{jk})$ is determined relative to these corrected measured values of the second reference object 2 and the rotations $D_{2k}$ carried out with this second reference object 2. It is likewise to be approximated by the fit function base $\bar{k}_i(\bar{r}_{jk}$ originally prescribed for the first correction function $\bar{K}_1(\bar{r}_{jk})$. For this purpose, a determination is made of all the linear combinations $\bar{S}(\bar{r})$ which are rotationally symmetrical relative to the rotations $D_{2k}$ carried out on the second reference object 2 about the second rotation axis 7. This originally prescribed fit function base $\bar{k}_i(\bar{r}_{jk})$ is then converted into a new one from linear functions of these fit functions $\bar{k}_i(\bar{r}_{jk})$ for each such rotationally symmetrical linear combination $\bar{S}(\bar{r})$ found, and the linear combination $\bar{S}(\bar{r})$ is deleted therefrom. Here, as well, the dimension of the function space defined by the fit function base is reduced by 1 with each deleted linear combination $\bar{S}(\bar{r})$.

Once all the linear combinations $\bar{S}(\bar{r})$ which are symmetrical relative to rotations of the second reference object 2 are removed, a second correction function $\bar{K}_2(\bar{r}_{jk})$ is determined in a known way. This now includes no linear combinations $\bar{S}(\bar{r})$ which are rotationally symmetrical relative to all the rotations $D_{2k}$ about the second rotation axis 7, which were used in the case of the second reference object 2. However, they do include linear combinations which are rotationally symmetrical relative to the first rotation axis 6 and were used in the case of the rotations $D_{1k}$ of the first reference object 1.

Likewise, the initially determined correction function $\bar{K}_1(\bar{r}_{jk})$ does not contain any linear combinations which are rotationally symmetrical relative to the first rotation axis 6 and were used in rotating the first reference object 1. However, it does include linear combinations $\bar{S}(\bar{r})$ which are rotationally symmetrical relative to the rotations about the second rotation axis 7 and were used in the case of the measurements with the second reference object 2.

The aim is now to specify an overall correction function in which the linear combinations $\bar{S}(\bar{r})$ which are rotationally symmetrical relative to the rotations $D_{1k}$ and $D_{2k}$ about both rotation axes, used on the two reference objects 1, 2 are included. Only then are those errors corrected which are assigned the fit functions included in the missing rotationally symmetrical linear combinations. For this purpose, an overall correction function $$\bar{K}_{Ges}(\bar{r}_{jk}) = \bar{K}_1(\bar{r}_{jk}) + \bar{K}_2(\bar{r}_{jk})$$

is generated by adding the first correction function $\bar{K}_1(\bar{r}_{jk})$ to the second correction function $\bar{K}(\bar{r}_{jk})$. Thus, this overall correction function $\bar{K}_{Ges}(\bar{r}_{jk})$ again includes all the rotationally symmetrical linear combinations $\bar{S}(\bar{r})$ removed for the purpose of determining the fit functions, and the fit functions redefine the full function space.

| List of reference numerals | |
|---|---|
| 1 | First reference object |
| 2 | Second reference object |
| 3 | Object table of the coordinate-measuring machine |
| 4 | Mark |
| 5 | Reference structures |
| 6 | Rotation axis of the first reference object 1 |
| 7 | Rotation axis of the second reference object 2 |

What is claimed is:

1. A method for determining a correction function $\bar{K}(\bar{r}_{jk})$ for rectifying the coordinate-dependent measuring errors of a coordinate-measuring machine by selfcalibration, comprising, in a stepwise fashion:

a) measuring initial coordinates $\bar{r}_{j0}$ in relation to a number j of reference structures (5) on a rigid, uncalibrated reference object (1) disposed on an object table of the coordinate-measuring machine in an initial orientation k=0 of the reference object (1), and measuring calibration coordinates $\bar{r}_{jk}$ in a number $k \geq 1$ of different calibration orientations produced by rotation from the initial orientation, wherein the calibration orientations are produced by rotations with the aid of rotation functions $D_k$ about a single rotation axis (6) of the reference object (1), b) operating a coordinate dependent correction function $\bar{K}(\bar{r}_{jk})$ upon the initial coordinates $\bar{r}_{j0}$ and the calibration coordinates $\bar{r}_{jk}$, the coordinate-dependent correction function $\bar{K}(\bar{r}_{jk})$ is described by an approximation $$\bar{K}(\bar{r}_{jk}) \approx \sum_{i=0}^{N} a_i * \bar{k}_i(\bar{r}_{jk})$$

with initially unknown fit parameters $a_i$ and a number N of prescribed, linearly independent fit functions $\bar{k}_i(\bar{r}_{jk})$;

c) performing rotation functions $D_k$ upon the corrected calibration coordinates $(\bar{r}_{jk} + \bar{K}(\bar{r}_{jk}))$; given by the calibration coordinates $\bar{r}_{jk}$ operated upon by the correction function $\bar{K}(\bar{r}_{jk})$ to rotate back the calibration coordinates into the initial orientation;

d) calculating fit parameters $a_i$ such that in relation to a reference structure (5) in each case all the corrected and rotated-back calibration coordinates $D_k(\bar{r}_{jk} + \bar{K}(\bar{r}_{jk}))$ and the corrected initial coordinates $(\bar{r}_{j0} + \bar{K}(\bar{r}_{j0}))$ substantially agree, and e) generating a continuous correction function $\bar{K}(\bar{r}_{jk})$ to be applied to arbitrary coordinates to be measured wherein, from the fit functions $\bar{k}_i(\bar{r}_{jk})$, no linear combinations can be formed which go over into themselves for all the rotations $D_k$ carried out.

2. The method according to claim 1, wherein:

a) the initial coordinates $\bar{r}_{1j0}$ and the calibration coordinates $\bar{r}_{1jk}$ are measured on a first reference object (1) with a first, fixed rotation axis (6), b) the initial coordinates $\bar{r}_{2j0}$ and the calibration coordinates $\bar{r}_{2jk}$ are measured on a second reference object (2) with a second, fixed rotation axis (7), c) all the measured initial and calibration coordinates are operated upon by the same correction function $\bar{K}(\bar{r}_{jk})$ d) the corrected calibration coordinates $(\bar{r}_{1jk} + \bar{K}(\bar{r}_{jk}))$ and ($\bar{r}_{2jk} + \bar{K}(\bar{r}_{jk})$), given by $\bar{r}_{1jk}$ and $\bar{r}_{2jk}$, operated upon by the correction function $\bar{K}(\bar{r}_{jk})$ are rotated back into their respective initial orientation for each reference object (1, 2) separately using the rotation functions $D_k$, e) and the fit parameters $a_i$ are calculated such that on each reference object (1) and (2) all the rotated-back and corrected calibration coordinates and initial coordinates separately substantially agree in relation to each reference structure (5).

3. Method according to claim 1, characterized a) in that in relation to the prescribed fit functions $\bar{k}_i(\bar{r}_{jk})$ a determination is made of all the rotationally symmetrical linear combinations $$\bar{S}(\bar{r}) = \sum_{i=0}^{P} s_i \cdot \bar{k}_i(\bar{r}_{jk})$$

of an arbitrary number P<N of the fit functions $\overline{k}_i(\overline{r}_{jk})$ with the fit parameters $s_i$ which fulfill the symmetry condition $\overline{S}(\overline{r})=D_k\overline{S}(\overline{r})$ for the rotation functions $D_k$, b) in that given the existence of such a rotationally symmetrical linear combination $\overline{S}(\overline{r})$ the previous set of linearly independent fit functions $\overline{k}_i(\overline{r}_{jk})$ is replaced by a new set of linearly independent fit functions $\overline{k}_i^{(1)}(\overline{r}_{jk})$, these new fit functions $\overline{k}_i^{(1)}(\overline{r}_{jk})$ in each case being linear combinations of the previous $\overline{k}_i(\overline{r}_{jk})$ and defining the same function space, and one of the new fit functions, specifically $\overline{k}_N^{(1)}(\overline{r})$, being the rotationally symmetrical linear combination $\overline{S}(\overline{r})$ c) in that the rotationally symmetrical linear combination $\overline{S}(\overline{r})=\overline{k}_N^{(1)}(\overline{r}_{jk})$ is deleted from the set of fit functions $\overline{k}_i^{(1)}(\overline{r}_{jk})$ so that their number is only N−1, d) in that the said method steps a), b), c), are repeated until there is no longer any linear combination $\overline{S}(\overline{r})$ which fulfills the symmetry condition $\overline{S}(\overline{r})=D_k\cdot\overline{S}(\overline{r})$ for the rotation function $D_k$, e) and in that correction function $\overline{K}(\overline{r}_{jk})$ is calculated by means of the set of fit functions $\overline{k}_i^{(M)}(\overline{r}_{jk})$ generated after the M-fold repetition of the above described method steps a), b), c).

4. Method according to claim 3, characterized a) in that using a first reference object (1) and rotations $D_{1k}$ about a first, fixed rotation axis (6) a first correction function is determined $\overline{K}_1(\overline{r}_{jk})$ is determined which no longer includes any rotationally symmetrical linear combinations $\overline{S}(\overline{r})$ relative to all the rotations $D_{jk}$ about the first rotation axis (6), but in return includes rotationally symmetrical linear combinations $\overline{S}(\overline{r})$ relative to other, unused rotation axes, b) in that further calibration measurements are carried out using a second reference object (2) and rotations with rotation functions $D_{2k}$ about a second, fixed rotation axis (7), differing from the first, in which case all the measured initial coordinates $\overline{r}_{2j0}$ and calibration coordinates $\overline{r}_{2jk}$ of the second reference object (2) are corrected by means of the already calculated first correction function $\overline{K}_1(\overline{r}_{jk})$, the calibration coordinates corrected by means of the first correction function $\overline{K}_1(\overline{r}_{jk})$ are then operated upon by a second correction function $\overline{K}_2(\overline{r}_{jk})$, still to be determined, and are rotated back into their initial orientation by means of the rotation functions $D_{2k}$, and in that herefrom a second correction function $\overline{K}_2(\overline{r}_{jk})$ is determined, which no longer includes any rotationally symmetrical linear combinations $\overline{S}(\overline{r})$ relative to all the rotations $D_{2k}$ about the second rotation axis (7), but in return includes rotationally symmetrical linear combinations $\overline{S}(\overline{r})$ relative to all the rotations $D_{1k}$ about the first rotation axis (6), c) and in that by adding the first correction function $\overline{K}_1(\overline{r}_{jk})$ to the second correction function $\overline{K}_1(\overline{r}_{jk})$ a total correction function $$\overline{k}_{Ges}(\overline{r}_{jk})=\overline{K}_1(\overline{r}_{jk})+\overline{K}_2(\overline{r}_{jk})$$

is calculated which includes rotationally symmetrical linear combinations $\overline{S}(\overline{r})$ relative to the rotations $D_{1k}$ and $D_{2k}$ used about the two rotation axes.

5. Method according to claim 4, characterized in that for the purpose of stepwise refinement of the correction function $\overline{k}_{Ges}(\overline{r}_{jk})$, step b) of claim 2 is repeated with further reference objects and further, previously unused rotation axes assigned thereto, and the correction functions determined are repeatedly added up.

6. Method according to claim 2, characterized in that one of the reference objects covers the entire measuring range of the coordinate-measuring machine.

7. Method according to claim 1, characterized in that the reference object is square and the rotation axis runs through its center.

\* \* \* \* \*